United States Patent [19]
Witt

[11] 3,909,899
[45] Oct. 7, 1975

[54] EXTRACTION TOOL FOR INTEGRATED CIRCUITS

[76] Inventor: Wilbur W. Witt, Apt. 11-B, The Racquet Club Apts., Zanesville, Ohio 43701

[22] Filed: Dec. 11, 1974

[21] Appl. No.: 531,756

[52] U.S. Cl. .................................... 29/203 H; 29/278
[51] Int. Cl.² ............................................ B25B 27/14
[58] Field of Search .......... 29/203 H, 203 HM, 270, 29/278

[56] References Cited

UNITED STATES PATENTS

| | | | |
|---|---|---|---|
| 1,357,012 | 10/1920 | Tweto | 29/278 |
| 2,491,132 | 12/1949 | Pothier et al. | 29/270 |
| 3,443,297 | 5/1969 | Lusby, Jr. | 29/203 H |
| 3,832,764 | 6/1974 | Fletcher et al. | 29/203 H |

*Primary Examiner*—Al Lawrence Smith
*Assistant Examiner*—Harold P. Smith, Jr.
*Attorney, Agent, or Firm*—Peter L. Berger

[57] ABSTRACT

A manually held universal extraction tool for removing integrated circuits from sockets. The tool as disclosed can be operated with one hand and primarily includes a plunger located within a barrel movable therewith, the barrel having a hooked member attached thereto. The barrel is movable upwardly and the amount of upward movement is controlled by an adjustment member so that the hook moved with the barrel will lift the integrated circuit from the socket, when the hook is placed in the relief formed between the integrated circuit in socket.

8 Claims, 3 Drawing Figures

EXTRACTION TOOL FOR INTEGRATED CIRCUITS

BACKGROUND OF THE INVENTION

This invention relates to a universal tool for removing dual-in-line integrated circuitry packages from their sockets, and more particularly, to such a tool which can be used manually in a single hand.

Integrated circuit packages are finding increased and widespread use throughout the electronics industry due to their low cost efficient operation and generally superior advantages. These integrated circuits are generally connected to corresponding socket members by means of electrical leads which depend from the bottom of the integrated circuits and are connected and wrapped under the respective integrated circuit sockets. It sometimes occurs that it is necessary to remove the integrated circuit package from the socket, and the removal process often results in damaging the leads, bending them or otherwise making it difficult to reinsert the integrated circuit back in the socket.

Frequently, repairmen operating with such integrated circuits use screwdrivers or other pointed devices and place the tip of the screwdriver in the relief formed between the integrated circuit and the socket. By prying the integrated circuit upwardly, the leads are forced from the socket and the integrated circuit is lifted from the socket. Since the amount of lift cannot be easily controlled by such clumsy, cumbersome techniques, the electrical leads depending from the bottom of the integrated circuit frequently become bent, broken and otherwise cause the integrated circuit to become useless. This removal of the integrated circuit from the socket is also required when the integrated circuits are checked not only for malfunctions but regular testing.

In order to replace the integrated circuits back into the socket, the leads must be very accurately straightened so as to facilitate such replacement. With the prior technique for removing the integrated circuits, the leads as removed become quite bent and otherwise disfigured and make straightening thereof relatively difficult.

An object of my invention is to provide a universal tool for removing integrated circuits from corresponding sockets.

Another object of my invention is to provide such a universal tool which can be conveniently and easily manipulated with a single hand.

Yet another object of my invention is to provide such a universal tool in which the amount of lift or jacking by the universal tool is controlled so as to facilitate removal of the integrated circuit yet not destroy or significantly bend the integrated circuit leads as they are removed from the socket.

Another object of my invention is to provide such a universal tool in which the amount of lift or jacking can be easily and quickly adjusted so as to adapt to different types of integrated circuits and sockets and different sizes thereof.

Another object of my invention is to provide such a universal tool which may be easily, efficiently and inexpensively manufactured and which will find widespread distribution and use.

Yet another object of my invention is to provide such a universal tool which may be used with all known existing manufactured sockets which incorporate the dual-in-line principle including the dual four and up principle.

Other objects, advantages and features of this invention will become more apparent hereinafter.

SUMMARY OF THE INVENTION

In accordance with the principles of this invention, the above objects are accomplished by providing a unique and novel manually held extraction tool for removing an integrated circuit package from a corresponding socket to which it is attached by leads depending therefrom, the extraction tool including a barrel and a plunger with the barrel movable on the plunger, a hook connected to the barrel, the hook being placed in a relief formed between the integrated circuit and the socket, the amount of lift of the barrel and hook being controlled by stop means associated with the plunger to ensure the removal of the integrated circuit without bending or otherwise damaging the leads. Further, there is provided leg members depending from the barrel ensuring a firm and solid grip upon the top of the integrated circuits so as to further facilitate the ease and use of my universal tool invention.

As another feature of this invention, there is provided adjustment means for adjusting the amount of lift or jack of the universal tool so as to enable it to be used for a variety of different sized integrated circuits and their sockets. A thumb rest is provided at the top of the tool to further facilitate the operation thereof and ensure its widespread acceptance.

DETAILED DESCRIPTION

Figure 1:
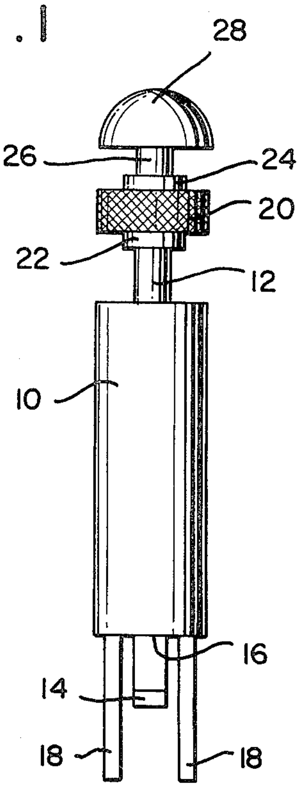
FIG. 1 is a front view of the universal tool of my invention.

Referring to the figures, there is shown in FIG. 1 an embodiment of my invention in which there is provided a barrel 10 movable on a plunger 12, the barrel and plunger being coaxial. A hook 14 depends from the bottom of barrel 10 and may be integrally connected therewith as at 16 to be moved when the barrel is moved. A pair of legs 18—18 depend from the bottom of the barrel and remain fixed and do not move when the barrel is moved upwardly. The legs are spaced apart with the hook member 14 being moved upwardly therebetween. The plunger 12 is connected to a rotatable knurled adjustment means 20, rotatable along the axis of the plunger 12, the adjustment means forming a stop controlling the upward movement of barrel 10. A spacer 22 is provided between the plunger 12 and adjustment member 20 and a spacer 24 is provided between the upward portion of adjustment means 20 and a shaft 26, the top portion of the shaft terminating in a thumb rest 28 to facilitate the manual gripping with a single hand of my universal tool.

The adjustment means is rotatable on the vertical axis and by such rotation controls the vertical movement of barrel 10.

Figure 2:
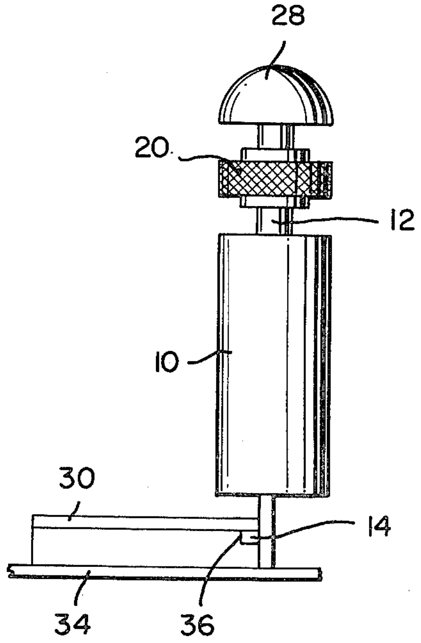
FIG. 2 is a side elevation view of my universal tool being inserted in the relief between the integrated circuit and socket.
Figure 3:
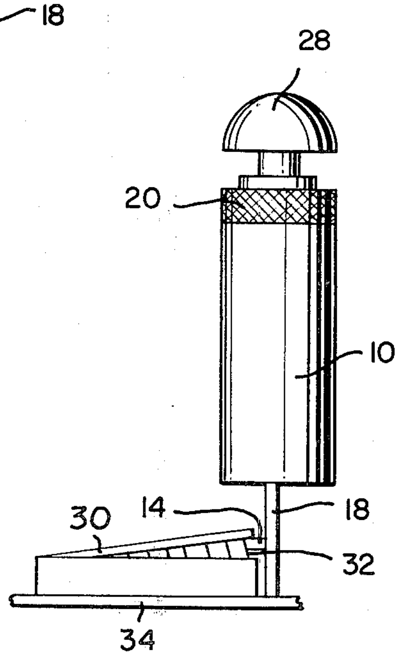
FIG. 3 is a view similar to FIG. 2 showing the barrel moved up on the plunger lifting the integrated circuit from the socket.

Referring now to FIGS. 2 and 3, there is shown my universal tool in operation with an integrated circuit package and printed circuit board or chassis socket. The integrated circuit is shown at 30 having a plurality of leads 32 (FIG. 3) depending therefrom for connection with the printed circuit board or chassis socket 34. A relief 36 is formed between the socket 34 and integrated circuit package 30 into which the hook 14 is placed. The manual tool of my invention is operated by gripping the barrel 10 with the fingers and depressing on the thumb rest 28 with the thumb pulling the barrel upward vertically lifting the integrated circuit and leads from the socket 34. By controlling the amount of lift of the barrel 10, the integrated circuit leads 32 are removed from the socket without significant bending or damage.

The controlled lift height or jacking of the barrel prevents the opposite end leads of the integrated circuit package from being bent while the other side is being lifted. The adjustment is desired because of the different lengths of the integrated circuit packages so as to ensure that the lifting of one side does not cause a serious bending or otherwise damage to the leads at the other side of the integrated circuit. In operation, of course, the other end of the integrated circuit is removed from the socket in a manner similar to that shown in FIG. 3 so that the integrated circuit is removed from the corresponding socket.

My universal tool can be made inexpensively out of aluminum, plastics or other materials and its low cost plus widespread applicability enhances its attractiveness as a commercial tool.

It will thus be seen that the objects set forth above, among those made apparent from the preceding description, are efficiently attained and, since certain changes may be made in the above invention without departing from the scope of the invention, it is intended that all matter contained in the above description and shown in the accompanying drawings shall be interpreted as illustrative and not in a limiting sense.

What is claimed:

1. A manually held extraction tool for removing an integrated circuit package from a socket to which it is attached, said integrated circuit having a plurality of electrical leads extending therefrom and being connected to said socket, said extraction tool comprising a barrel, a plunger movable within said barrel, said barrel serving to be manually gripped and held by one hand, a hook carried by said barrel, adjustable stop means on said plunger engageable with said barrel to control the amount of upward lift of said plunger, leg members attached to said barrel for resting said tool on said socket, said hook being inserted between the bottom of said integrated circuit and said socket to lift said integrated circuit from said socket, said lift amount being controlled by said stop member.

2. A manually held extraction tool as in claim 1, wherein said leg members comprise a pair of spaced apart legs, said hook member movable therebetween.

3. A manually held extraction tool as in claim 1, wherein said tool comprises a thumb rest formed at the top of said tool facilitating manual removal of said integrated circuit from said socket.

4. A manually held extraction tool as in claim 1, wherein said barrel and plunger are coaxial.

5. A manually held extraction tool as in claim 1, comprising a thumb rest formed on top of said plunger, said adjustable stop means connected to said plunger between said thumb rest and said barrel and being rotatable on said plunger to control the amount of upward movement of said barrel on said plunger until said barrel abuts said adjustment means.

6. A manually held extraction tool as in claim 1 wherein said hook is connected to said barrel to be moved therewith.

7. A manually held extraction tool as in claim 6, wherein said hook is integral with said barrel.

8. A manually held extraction tool as in claim 1, wherein said hook is located between said leg members.

* * * * *